(12) United States Patent
Kim et al.

(10) Patent No.: US 11,220,599 B2
(45) Date of Patent: Jan. 11, 2022

(54) THERMOPLASTIC RESIN COMPOSITION AND ARTICLE COMPRISING THE SAME

(71) Applicant: Lotte Advanced Materials Co., Ltd., Yeosu-si (KR)

(72) Inventors: Yang Il Kim, Uiwang-si (KR); Sang Hwa Lee, Uiwang-si (KR); Hyun Su Kim, Uiwang-si (KR); Sang Hyun Hong, Uiwang-si (KR)

(73) Assignee: Lotte Advanced Materials Co., Ltd., Yeosu-si (KR)

(*) Notice: Subject to any disclaimer, the term of this patent is extended or adjusted under 35 U.S.C. 154(b) by 42 days.

(21) Appl. No.: 16/690,469

(22) Filed: Nov. 21, 2019

(65) Prior Publication Data

US 2020/0165443 A1    May 28, 2020

(30) Foreign Application Priority Data

Nov. 26, 2018  (KR) .................... 10-2018-0147561
Sep. 19, 2019   (KR) .................... 10-2019-0115375

(51) Int. Cl.
  *C08L 67/02*   (2006.01)
  *H01L 33/60*   (2010.01)
(52) U.S. Cl.
  CPC ............. *C08L 67/02* (2013.01); *H01L 33/60* (2013.01); *C08L 2203/20* (2013.01)
(58) Field of Classification Search
  CPC ....... C08L 67/02; C08L 2203/20; H01L 33/60
  See application file for complete search history.

(56) References Cited

U.S. PATENT DOCUMENTS

| | | | |
|---|---|---|---|
| 9,437,790 B2 | 9/2016 | Kim et al. | |
| 2013/0034734 A1* | 2/2013 | Chang | C08L 67/02 428/412 |
| 2014/0191263 A1 | 7/2014 | Wang et al. | |
| 2014/0350163 A1* | 11/2014 | Kim | C08K 3/013 524/494 |
| 2017/0002196 A1* | 1/2017 | Park | C08L 23/0869 |

FOREIGN PATENT DOCUMENTS

| | | |
|---|---|---|
| KR | 10-2013-0076733 A | 7/2013 |
| KR | 10-2015-0104185 A | 9/2015 |

OTHER PUBLICATIONS

Office Action in counterpart Korean Application No. 10-2019-0115375 dated Oct. 6, 2021, pp. 1-4.

* cited by examiner

*Primary Examiner* — Bijan Ahvazi
(74) *Attorney, Agent, or Firm* — Additon, Pendleton & Witherspoon, P.A.

(57) ABSTRACT

A thermoplastic resin composition includes: a polyester resin including a repeat unit represented by Formula 1 as described in the specification; glass fibers; a white pigment; an aromatic vinyl-olefin copolymer; and talc. The thermoplastic resin composition can have good properties in terms of reflectance, reflectance retention, impact resistance, and/or moldability.

12 Claims, 1 Drawing Sheet

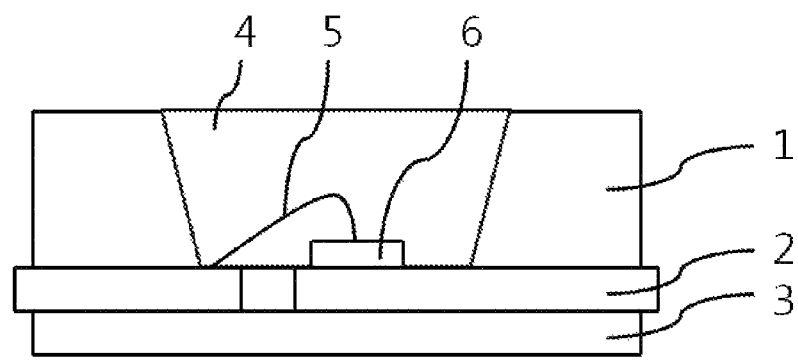

THERMOPLASTIC RESIN COMPOSITION AND ARTICLE COMPRISING THE SAME

CROSS-REFERENCE TO RELATED APPLICATION

This application claims priority under 35 USC Section 119 to and the benefit of Korean Patent Application No. 10-2018-0147561, filed on Nov. 26, 2018, and Korean Patent Application No. 10-2019-0115375, filed on Sep. 19, 2019, the entire disclosure of each of which is incorporated herein by reference.

FIELD

The present invention relates to a thermoplastic resin composition and a molded article including the same.

BACKGROUND

Light emitting diodes (LEDs) and organic light emitting diodes (OLEDs) are rapidly replacing existing light sources and attract attention due to outstanding energy efficiency and long lifespan thereof. Generally, light emitting diodes form a light emitting diode package together with components, such as a reflector, a reflector cup, a scrambler, and a housing, so as to maximize optical efficiency through high reflectance. Such components are required to withstand high temperature while suppressing deterioration in reflectance and whiteness due to yellowing.

As engineering plastics, polyester resins, copolymers thereof, and blends thereof exhibit useful properties and are used in various fields including interior/exterior materials for products, as well as used as a material for such components. Examples of polyester resins mainly used as a material for the components include highly heat-resistant polyester resins. However, highly heat-resistant polyester resins have problems of low crystallization rate, low mechanical strength, and poor impact resistance, despite having high deformation resistance and discoloration resistance at high temperatures.

In order to overcome these problems, typically, additives such as inorganic fillers are added to the polyester resins to improve impact resistance and rigidity. However, an excess of additives such as inorganic fillers can cause deterioration in moldability, such as bleed-out.

Moreover, in order to obtain a thermoplastic resin composition capable of realizing high reflectance, it is necessary to increase the content of white pigments in the thermoplastic resin. However, such a thermoplastic resin composition can have poor impact resistance due to an excess of white pigment, inorganic fillers, and the like.

Therefore, there is a need for a thermoplastic resin composition which has good properties in terms of reflectance, reflectance retention, impact resistance, and moldability so as to be used as a material for components of light emitting diodes.

SUMMARY OF THE INVENTION

The present disclosure provides a thermoplastic resin composition which can have good properties in terms of reflectance, reflectance retention, impact resistance, and/or moldability, and a molded article formed of the same.

The thermoplastic resin composition includes: a polyester resin including a repeat unit represented by Formula 1; glass fibers; a white pigment; an aromatic vinyl-olefin copolymer; and talc:

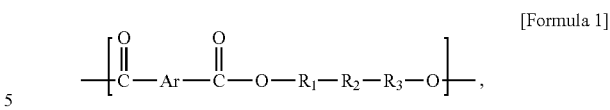

wherein Ar is a $C_6$ to $C_{18}$ arylene group, $R_1$ and $R_3$ are each independently a $C_1$ to $C_{10}$ linear alkylene group, and $R_2$ is a $C_5$ to $C_{12}$ cyclic alkylene group.

The thermoplastic resin composition may include: about 100 parts by weight of the polyester resin; about 1 part by weight to about 60 parts by weight of the glass fibers; about 20 parts by weight to about 90 parts by weight of the white pigment; about 0.1 parts by weight to about 15 parts by weight of the aromatic vinyl-olefin copolymer; and about 0.1 parts by weight to about 10 parts by weight of the talc.

The polyester resin may include a repeat unit represented by Formula 1a:

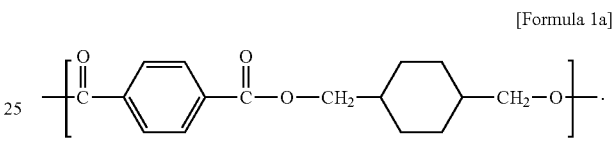

The white pigment may include titanium oxide, zinc oxide, zinc sulfide, zinc sulfate, barium sulfate, calcium carbonate, and/or alumina.

The aromatic vinyl-olefin copolymer may include a styrene-butylene block copolymer, a styrene-isobutylene block copolymer, a styrene-isobutylene-styrene block copolymer, a styrene-ethylene-butylene-styrene block copolymer, and/or a maleic anhydride-grafted styrene-ethylene-butylene-styrene block copolymer.

The aromatic vinyl-olefin copolymer and the talc may be present in a weight ratio of about 1:0.01 to about 1:10.

The thermoplastic resin composition may have a reflectance of about 92% to about 99%, as measured on a specimen having a size of 90 mm×50 mm×2.5 mm under illumination at a wavelength of 450 nm in accordance with ASTM E1331.

The thermoplastic resin composition may have a reflectance retention rate of about 90% to about 99%, as calculated according to Equation 1:

Reflectance retention rate (%)=$[(Rf_0-Rf_1)/Rf_0]\times 100$   [Equation 1]

wherein $Rf_0$ is an initial reflectance of a specimen having a size of 90 mm×50 mm×2.5 mm, as measured under illumination at a wavelength of 450 nm in accordance with ASTM E1331, and $Rf_1$ is a reflectance of the specimen, as measured under illumination at a wavelength of 450 nm in accordance with ASTM E1331 after a constant temperature/humidity test in which the specimen is left at 85° C. and 85% relative humidity (RH) for 300 hours.

The thermoplastic resin composition may have an unnotched Izod impact strength of about 10 kgf·cm/cm to about 30 kgf·cm/cm, as measured on a ⅛" thick Izod specimen in accordance with ASTM D256.

The present disclosure also relates to a molded article. The molded article is formed of the thermoplastic resin composition described herein. The molded article may be a reflector and/or reflector cup for LEDs.

BRIEF DESCRIPTION OF DRAWINGS

FIG. 1 is a sectional view of a semiconductor device including a reflector cup formed of the thermoplastic resin composition according to one embodiment of the present disclosure.

DETAILED DESCRIPTION

The above and other aspects, features, and advantages of the present invention will become apparent from the detailed description of the following embodiments. It should be understood that the present invention is not limited to the following embodiments and may be embodied in different ways by those skilled in the art without departing from the scope of the present invention. Rather, the embodiments are provided for complete disclosure and to provide thorough understanding of the present invention by those skilled in the art. The scope of the present invention should be defined only by the appended claims.

A thermoplastic resin composition according to the present disclosure includes: (A) a polyester resin; (B) glass fibers; (C) a white pigment; (D) an aromatic vinyl-olefin copolymer; and (E) talc.

As used herein to represent a specific numerical range, the expression "a to b" means "≥a and ≤b".

(A) Polyester Resin

The polyester resin according to embodiments of the present disclosure serves to improve heat resistance, mechanical strength, such as rigidity, and/or impact resistance of the thermoplastic resin composition even at high temperature, and may include a repeat unit represented by Formula 1:

[Formula 1]

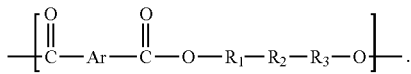

In Formula 1, Ar is a $C_6$ to $C_{18}$ arylene group, $R_1$ and $R_3$ are each independently a $C_1$ to $C_{10}$ linear alkylene group, and $R_2$ is a $C_5$ to $C_{12}$ cyclic alkylene group. Here, $R_1$, $R_2$, and $R_3$ are derived from an alicyclic diol and may have a total carbon number of 7 to 22. The polyester resin contains a cyclic structure in a main chain thereof and thus has a high melting point of about 200° C. or higher, without being limited thereto.

The aromatic polyester resin may be prepared by polycondensation of a dicarboxylic acid component including an aromatic dicarboxylic acid and/or a derivative thereof with a diol component including an alicyclic diol. Here, polycondensation may be performed by any polycondensation method known in the art.

Examples of the dicarboxylic acid component may include terephthalic acid, isophthalic acid, 1,2-naphthalene dicarboxylic acid, 1,4-naphthalene dicarboxylic acid, 1,5-naphthalene dicarboxylic acid, 1,6-naphthalene dicarboxylic acid, 1,7-naphthalene dicarboxylic acid, 1,8-naphthalene dicarboxylic acid, 2,3-naphthalene dicarboxylic acid, 2,6-naphthalene dicarboxylic acid, and/or 2,7-naphthalene dicarboxylic acid, without being limited thereto. These may be used alone or as a mixture thereof.

The alicyclic diol may include a $C_7$ to $C_{22}$ alicyclic diol, for example, 1,4-cyclohexanedimethanol (CHDM), without being limited thereto.

The polyester resin may be a polycyclohexylenedimethylene terephthalate (PCT) resin including a repeat unit represented by Formula 1a:

[Formula 1a]

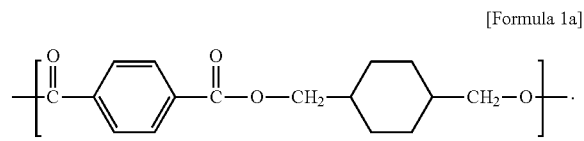

The polyester resin may have a weight average molecular weight of about 3,000 g/mol to about 200,000 g/mol, for example, about 5,000 g/mol to about 150,000 g/mol, as measured in hexafluoroisopropanol (HFIP) by gel permeation chromatography (GPC). Within this range, the thermoplastic resin composition can have good properties in terms of processability, impact resistance, and/or rigidity.

(B) Glass Fibers

The glass fibers according to embodiments of the present disclosure serve to improve rigidity and/or impact resistance of the thermoplastic resin composition, and may include circular cross-section glass fibers, flat glass fibers, and mixtures and/or combinations thereof.

The circular cross-section glass fibers may have an average cross-sectional diameter of about 6 μm to about 8 μm, for example, about 6 μm to about 7.5 μm, as measured using an optical microscope. Within this range, the thermoplastic resin composition can have good properties in terms of rigidity and/or appearance characteristics.

The flat glass fibers may be typical flat glass fibers used in thermoplastic resin compositions and may have a cross-sectional aspect ratio of about 1.5 to about 8, for example about 1.6 to about 5, and a minor diameter of about 6 μm to about 12 μm, as measured using an optical microscope. Within these ranges, the thermoplastic resin composition (molded article) can exhibit improved properties in terms of surface smoothness and/or reflectance.

The glass fibers may have an average pre-extrusion (pre-processing) length of about 1 mm to about 5 mm and an average post-extrusion (post-processing) length of about 100 μm to about 700 μm, for example, about 110 μm to about 690 μm. Within these ranges, the thermoplastic resin composition can have good properties in terms of impact resistance, rigidity, and/or appearance characteristics.

The glass fibers may be subjected to surface coating with a surface treatment agent to increase coupling force to other components of the thermoplastic resin composition, such as the polyester resin. Examples of the surface treatment agent may include silane compounds, urethane compounds, and/or epoxy compounds, without being limited thereto.

The glass fibers may be present in an amount of about 1 part by weight to about 60 parts by weight, for example, about 10 parts by weight to about 50 parts by weight, relative to about 100 parts by weight of the polyester resin. In some embodiments, the thermoplastic resin composition can include the glass fibers in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 parts by weight, based on about 100 parts by weight of the polyester resin. Further, according to some embodiments, the glass fibers can be present in an amount of from about any of the foregoing amounts to about any other of the foregoing amounts.

Within this range, the thermoplastic resin composition can have good properties in terms of impact resistance, rigidity, and/or processability.

(C) White Pigment

The white pigment according to embodiments of the present disclosure serves to improve whiteness, reflectance, discoloration resistance, and/or light stability of the thermoplastic resin composition in conjunction with the other components and may include any typical white pigment without limitation. Examples of the white pigment may include without limitation titanium oxide, zinc oxide, zinc sulfide, zinc sulfate, barium sulfate, calcium carbonate, alumina, and/or white lead ($2PbCO_3 \cdot Pb(OH)_2$). These may be used alone or as a mixture thereof. For example, the white pigment may be titanium oxide ($TiO_2$) having a rutile or tetragonal crystal structure.

The white pigment may have an average particle diameter of about 0.01 μm to about 2.0 μm, for example, about 0.05 μm to about 0.7 μm. Within this range, the thermoplastic resin composition can have good properties in terms of whiteness and/or reflectance. Herein, the average particle diameter refers to a number average particle diameter represented by D50 (median value of particle size distribution).

The white pigment may be subjected to surface treatment with an organic surface treatment agent and/or an inorganic surface treatment agent. Examples of the organic surface treatment agent may include silane coupling agents, polydimethylsiloxane, trimethylolpropane (TMP), and/or pentaerythritol, and the like, and mixtures and/or combinations thereof, without being limited thereto. Examples of the silane coupling agents may include without limitation vinyltriethoxysilane, 2-aminopropyltriethoxysilane, and/or 2-glycidoxypropyltriethoxysilane, and the like, and mixtures and/or combinations thereof. Examples of the inorganic surface treatment agents may include without limitation aluminum oxide (alumina, $Al_2O_3$), silicon dioxide (silica, $SiO_2$), zirconia (zirconium dioxide, $ZrO_2$), sodium silicate, sodium aluminate, sodium aluminum silicate, zinc oxide, and/or mica, and the like, and mixtures and/or combinations thereof. Upon surface treatment, the organic or inorganic surface treatment agent may be present in an amount of 5 parts by weight or less relative to about 100 parts by weight of the white pigment. Within this range, the thermoplastic resin composition can have further improved properties in terms of whiteness and/or reflectance.

The white pigment may be present in an amount of about 20 parts by weight to about 90 parts by weight, for example about 30 parts by weight to about 80 parts by weight, relative to about 100 parts by weight of the polyester resin. In some embodiments, the thermoplastic resin composition can include the white pigment in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 parts by weight, based on about 100 parts by weight of the polyester resin. Further, according to some embodiments, the white pigment can be present in an amount of from about any of the foregoing amounts to about any other of the foregoing amounts.

Within this range, the thermoplastic resin composition can have good properties in terms of reflectance and/or whiteness.

(D) Aromatic Vinyl-Olefin Copolymer

The aromatic vinyl-olefin copolymer according to embodiments of the present disclosure serves to improve reflectance, reflectance retention, impact resistance, and/or moldability of the thermoplastic resin composition in conjunction with the talc and the like, and may be a polymer of a reaction mixture including an aromatic vinyl monomer and an olefin monomer.

Examples of the aromatic vinyl-olefin copolymer may include without limitation a styrene-butylene block copolymer, a styrene-isobutylene block copolymer, a styrene-isobutylene-styrene block copolymer, a styrene-ethylene-butylene-styrene block copolymer, and/or a maleic anhydride-grafted styrene-ethylene-butylene-styrene block copolymer, and the like, and mixtures and/or combinations thereof.

The aromatic vinyl-olefin copolymer may include about 50 wt % to about 95 wt %, for example, about 55 wt % to about 90 wt %, of the olefin monomer and about 5 wt % to about 50 wt %, for example, about 10 wt % to about 45 wt %, of the aromatic vinyl monomer. Within this range, the thermoplastic resin composition can have good properties in terms of reflectance and/or impact resistance.

In some embodiments, the aromatic vinyl-olefin copolymer can include the olefin monomer in an amount of about 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %, based on the total weight (100 wt %) of the aromatic vinyl-olefin copolymer. Further, according to some embodiments, the olefin monomer can be present in an amount of from about any of the foregoing amounts to about any other of the foregoing amounts.

In some embodiments, the aromatic vinyl-olefin copolymer can include the aromatic vinyl monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %, based on the total weight (100 wt %) of the aromatic vinyl-olefin copolymer. Further, according to some embodiments, the aromatic vinyl monomer can be present in an amount of from about any of the foregoing amounts to about any other of the foregoing amounts.

The aromatic vinyl-olefin copolymer may have a weight average molecular weight (Mw) of about 10,000 g/mol to about 200,000 g/mol, for example, about 50,000 g/mol to about 150,000 g/mol, as measured by gel permeation chromatography (GPC). Within this range, the thermoplastic resin composition can have good properties in terms of reflectance and/or impact resistance.

The aromatic vinyl-olefin copolymer may be present in an amount of about 0.1 parts by weight to about 15 parts by weight, for example, about 0.5 parts by weight to about 10 parts by weight, relative to about 100 parts by weight of the polyester resin. In some embodiments, the thermoplastic resin composition can include the aromatic vinyl-olefin copolymer in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, or 15 parts by weight, based on about 100 parts by weight of the polyester resin. Further, according to some embodiments, the aromatic vinyl-olefin copolymer can be present in an amount of from about any of the foregoing amounts to about any other of the foregoing amounts.

Within this range, the thermoplastic resin composition can have good properties in terms of reflectance and/or impact resistance.

(E) Talc

The talc according to embodiments of the present disclosure serves to improve reflectance, reflectance retention, impact resistance, and/or moldability of the thermoplastic resin composition in conjunction with the aromatic vinyl-olefin copolymer and the like, and may include flake-shaped talc typically used in the art.

The talc may have an average particle size (D50: median value of particle size distribution) of about 1 μm to about 10 μm, for example, about 2 μm to about 9 μm, as measured using a particle size analyzer. Within this range, the thermoplastic resin composition can have good properties in terms of reflectance retention and the like.

The talc may be present in an amount of about 0.1 parts by weight to about 10 parts by weight, for example, about 0.1 parts by weight to about 7 parts by weight, relative to about 100 parts by weight of the polyester resin. In some embodiments, the thermoplastic resin composition can include the talc in an amount of about 0.1, 0.2, 0.3, 0.4, 0.5, 0.6, 0.7, 0.8, 0.9, 1, 2, 3, 4, 5, 6, 7, 8, 9, or 10 parts by weight, based on about 100 parts by weight of the polyester resin. Further, according to some embodiments, the talc can be present in an amount of from about any of the foregoing amounts to about any other of the foregoing amounts.

Within this range, the thermoplastic resin composition can have good properties in terms of reflectance, and/or reflectance retention, and the like.

The aromatic vinyl-olefin copolymer (D) and the talc (E) may be present in a weight ratio (D:E) of about 1:0.01 to about 1:10, for example, about 1:0.01 to about 1:7. In some embodiments, the aromatic vinyl-olefin copolymer (D) and the talc (E) may be present in a weight ratio (D:E) of about 1:0.01, 1:0.02, 1:0.03, 1:0.04, 1:0.05, 1:0.06, 1:0.07, 1:0.08, 1:0.09, 1:0.1, 1:0.2, 1:0.3, 1:0.4, 1:0.5, 1:0.6, 1:0.7, 1:0.8, 1:0.9, 1:1, 1:2, 1:3, 1:4, 1:5, 1:6, 1:7, 1:8, 1:9, or 1:10. Further, according to some embodiments, the aromatic vinyl-olefin copolymer (D) and the talc (E) may be present in a weight ratio (D:E) from about any of the foregoing ratios to about any other of the foregoing ratios.

Within this range, the thermoplastic resin composition can have further improved properties in terms of reflectance, reflectance retention, impact resistance, moldability, and balance therebetween.

The thermoplastic resin composition according to embodiments of the present disclosure may further include one or more additives typically used in the art without altering desired effects of the invention, as needed. Examples of the additive may include an antioxidant, a stabilizer, a flame retardant, a flame retardant aid, an anti-dripping agent, a nucleating agent, a release agent, an antibacterial agent, a surfactant, a coupling agent, a plasticizer, a compatibilizer, a lubricant, and/or an antistatic agent, and the like, and mixtures and/or combinations thereof, without being limited thereto.

Examples of the antioxidant may include without limitation phenol, amine, sulfur, and/or phosphorus antioxidants; examples of the stabilizer (heat stabilizer and/or light stabilizer) may include without limitation lactone, hydroquinone, halogenated copper, and/or iodine compounds; and examples of the flame retardant may include without limitation bromine, chlorine, phosphorus, antimony, and/or inorganic compounds.

The additive may be present in an amount of about 20 parts by weight or less, for example, about 0.1 parts by weight to about 15 parts by weight, relative to about 100 parts by weight of the polyester resin, without being limited thereto.

The thermoplastic resin composition according to embodiments of the present disclosure may have a reflectance of about 92% to about 99%, for example, about 92.5% to about 95%, as measured on a specimen having a size of 90 mm×50 mm×2.5 mm under illumination at a wavelength of 450 nm in accordance with ASTM E1331.

The thermoplastic resin composition may have a reflectance retention rate of about 90% to about 99%, for example, about 90.5% to about 94%, as calculated according to Equation 1:

Reflectance retention rate (%)=[($Rf_0$−$Rf_1$)/$Rf_0$]×100.   [Equation 1]

In Equation 1, $Rf_0$ is an initial reflectance of a specimen having a size of 90 mm×50 mm×2.5 mm, as measured under illumination at a wavelength of 450 nm in accordance with ASTM E1331, and $Rf_1$ is a reflectance of the specimen, as measured under illumination at a wavelength of 450 nm in accordance with ASTM E1331 after a constant temperature/humidity test in which the specimen is left at 85° C. and 85% RH for 300 hours.

The thermoplastic resin composition may have an unnotched Izod impact strength of about 10 kgf·cm/cm to about 30 kgf·cm/cm, for example, about 12 kgf·cm/cm to about 25 kgf·cm/cm, as measured on a ⅛" thick Izod specimen in accordance with ASTM D256.

The thermoplastic resin composition may have a release resistance force of about 210 N or less, for example, about 150 N to about 200 N, as determined by measuring force on a center ejector pin upon ejection of a circular injection molded specimen (diameter: 100 mm, thickness: 2 mm) using a pressure sensor. Within this range, the thermoplastic resin composition can have good releasability.

The thermoplastic resin composition according to embodiments of the present disclosure may be prepared by any suitable method known in the art. For example, the aforementioned components and, optionally, the additive(s) can be mixed using a Henschel mixer, a V blender, a tumbler blender, and/or a ribbon blender, followed by melt extrusion in a single screw extruder and/or a twin screw extruder at about 200° C. to about 350° C., thereby preparing the thermoplastic resin composition in pellet form.

A molded article according to the present disclosure is formed of the thermoplastic resin composition set forth above. For example, the molded article may be manufactured using the thermoplastic resin composition by a molding method known in the art, such as injection molding, dual injection molding, blow molding, extrusion, and thermoforming.

The molded article can have good properties in terms of reflectance, reflectance retention, impact resistance, rigidity, and/or heat resistance and thus can be used in light-reflection applications without limitation. For example, the molded article can be useful as a reflector for a light emitting device of electrical and/or electronic components, indoor and/or outdoor luminaires, automotive lighting devices, displays, and the like, for example, for a reflector and/or reflector cup for LEDs.

FIG. 1 is a sectional view of a semiconductor device (package) including a reflector cup formed of the thermoplastic resin composition according to an embodiment of the present disclosure. Referring to FIG. 1, the thermoplastic resin composition according to the disclosure may be formed into a reflector and/or reflector cup 1 of various shapes, and the prepared reflector cup 1 may be assembled with various known electrodes 2, substrates 3, sealing resins 4, wires 5, and light emitting diodes (LEDs) 6 to form products including light emitting diodes (LEDs) and/or organic light emitting diodes (OLEDs), such as semiconductor devices and luminaries. In addition, the constitution set forth above may be modified and changed in various ways by those skilled in the art.

Hereinafter, the present invention will be described in more detail with reference to the following examples. It should be understood that these examples are provided for illustration only and are not to be construed in any way as limiting the present invention.

EXAMPLES

Details of components used in Examples and Comparative Examples are as follows:

(A) Polyester Resin

A polycyclohexylenedimethylene terephthalate resin (manufacturer: SK Chemical, product name: Puratan0502) is used.

(B) Glass Fibers

Circular cross-section glass fibers (average diameter: 6.5 m, average length: 3 mm, manufacturer: CPIC, product name: ECS303W-3-E) are used.

(C) White Pigment

Titanium oxide ($TiO_2$, manufacturer: Tronox, product name: CR-470) is used.

(D) Vinyl Copolymer (D1) A styrene-ethylene-butylene-styrene block copolymer (manufacturer: Kraton, product name: G1652) is used as an aromatic vinyl-olefin copolymer.

(D2) An ethylene-butyl acrylate copolymer (manufacturer: DUPONT, product name: Elvaloy AC 3117) is used.

(E) Talc

Talc (manufacturer: HAYASHI KASEI, product name: KHP-255) is used.

(F) Mica

Mica (manufacturer: IMERYS, product name: SUZORITE 20-S) is used.

Examples 1 to 7 and Comparative Examples 1 to 6: Preparation and Evaluation of Thermoplastic Resin Composition The aforementioned components are mixed in amounts as listed in Tables 1 and 2, followed by melt extrusion at 300° C., thereby preparing a thermoplastic resin composition in pellet form. Here, extrusion is performed using a twin-screw extruder (L/D: 36, Φ: 45 mm). The prepared pellets are dried at 100° C. for 4 hours and then subjected to injection molding using a 6 oz. injection machine (molding temperature: 300° C., mold temperature: 130° C.), thereby preparing a specimen. The prepared specimen is evaluated as to reflectance, reflectance retention, unnotched Izod impact strength, and releasability. Results are shown in Tables 1 and 2.

Property Evaluation (1) Reflectance (unit: %): Reflectance (specular component included (SCI) mode) is measured on a specimen having a size of 90 mm×50 mm×2.5 mm under illumination at a wavelength of 450 nm (LED light source) in accordance with ASTM E1331. As a reflectometer, 3600 CIE Lab available from Konica Minolta Holdings, Inc. is used.

(2) Reflectance retention rate (unit: %): Reflectance retention rate is calculated according to Equation 1:

$$\text{Reflectance retention rate (\%)} = [(Rf_0 - Rf_1)/Rf_0] \times 100 \quad \text{[Equation 1]}$$

wherein $Rf_0$ is an initial reflectance of a specimen having a size of 90 mm×50 mm×2.5 mm, as measured under illumination at a wavelength of 450 nm in accordance with ASTM E1331, and $Rf_1$ is a reflectance of the specimen, as measured under illumination at a wavelength of 450 nm in accordance with ASTM E1331 after a constant temperature/humidity test in which the specimen is left at 85° C. and 85% RH for 300 hours.

(3) Unnotched Izod impact strength (unit: kgf·cm/cm): Unnotched Izod impact strength is measured on a ⅛" thick Izod specimen in accordance with ASTM D256.

(4) Releasability: Release resistance force (unit: N) is determined by measuring force on a center ejector pin upon ejection of a circular injection-molded specimen (diameter: 100 mm, thickness: 2 mm) using a pressure sensor.

TABLE 1

| | Example | | | | | | |
|---|---|---|---|---|---|---|---|
| | 1 | 2 | 3 | 4 | 5 | 6 | 7 |
| (A) (parts by weight) | 100 | 100 | 100 | 100 | 100 | 100 | 100 |
| (B) (parts by weight) | 30 | 30 | 30 | 30 | 30 | 30 | 30 |
| (C) (parts by weight) | 70 | 70 | 70 | 70 | 70 | 70 | 70 |
| (D1) (parts by weight) | 2 | 2 | 2 | 10 | 2 | 1 | 0.5 |
| (D2) (parts by weight) | — | — | — | — | — | — | — |
| (E) (parts by weight) | 0.2 | 2 | 6 | 2 | 10 | 8 | 5 |
| (F) (parts by weight) | — | — | — | — | — | — | — |
| (Initial) reflectance (%) | 93.1 | 93.3 | 92.8 | 92.9 | 92.1 | 92.3 | 92.5 |
| Reflectance (%) after constant temperature/humidity test | 84.7 | 85.2 | 84.3 | 85.9 | 83.9 | 84.2 | 84.9 |
| Reflectance retention rate (%) | 91.0 | 91.3 | 90.8 | 92.5 | 91.1 | 91.2 | 91.8 |
| Unnotched Izod impact strength (kgf·cm/cm) | 13.7 | 14.2 | 15.4 | 21.2 | 12.4 | 12.9 | 15.1 |
| Releasability (N) | 197 | 185 | 195 | 179 | 205 | 199 | 191 |

TABLE 2

| | Comparative Example | | | | | |
|---|---|---|---|---|---|---|
| | 1 | 2 | 3 | 4 | 5 | 6 |
| (A) (parts by weight) | 100 | 100 | 100 | 100 | 100 | 100 |
| (B) (parts by weight) | 30 | 30 | 30 | 30 | 30 | 30 |
| (C) (parts by weight) | 70 | 70 | 70 | 70 | 70 | 70 |
| (D1) (parts by weight) | — | — | — | 2 | 10 | 2 |
| (D2) (parts by weight) | 2 | 10 | — | — | — | — |
| (E) (parts by weight) | 2 | 2 | 2 | — | — | — |
| (F) (parts by weight) | — | — | — | 2 | 2 | — |
| (Initial) reflectance (%) | 90.9 | 89.7 | 91.2 | 92.5 | 92.9 | 93.1 |
| Reflectance (%) after constant temperature/humidity test | 82.4 | 82.6 | 83.1 | 80.4 | 81.1 | 82.1 |
| Reflectance retention rate (%) | 90.6 | 92.1 | 91.1 | 86.9 | 87.3 | 88.2 |
| Unnotched Izod impact strength (kgf·cm/cm) | 13.5 | 17.2 | 6.7 | 14.1 | 20.9 | 13.9 |
| Releasabihty (N) | 239 | 252 | 245 | 249 | 259 | 241 |

From the results shown in Table 1, it can be seen that the thermoplastic resin composition according to the present invention (Examples 1 to 7) exhibit good properties in terms of reflectance, reflectance retention, impact resistance (unnotched Izod impact strength), moldability (releasability and the like), and balance therebetween.

In contrast, it can be seen that the thermoplastic resin compositions of Comparative Examples 1 and 2, including the ethylene-butyl acrylate copolymer (D2) instead of the aromatic vinyl-olefin copolymer according to the present disclosure, exhibit poor properties in terms of reflectance and moldability, and the thermoplastic resin composition of Comparative Example 3, which does not include the aromatic vinyl-olefin copolymer according to the present disclosure, exhibits poor properties in terms of reflectance, impact resistance, and moldability. In addition, it can be seen that the thermoplastic resin compositions of Comparative Examples 4 and 5, including mica instead of the talc according to the present disclosure, exhibit poor properties in terms of reflectance retention and moldability, and the thermoplastic resin composition of Comparative Example 6, which does not include the talc according to the present disclosure, exhibits poor properties in terms of reflectance retention and moldability.

It is within the scope of this disclosure for one or more of the terms "substantially," "about," "approximately," and/or the like, to qualify each adjective and adverbs of the foregoing disclosure, to provide a broad disclosure. As an example, it is believed those of ordinary skill in the art will readily understand that, in different implementations of the features of this disclosure, reasonably different engineering tolerances, precision, and/or accuracy may be applicable and suitable for obtaining the desired result. Accordingly, it is believed those of ordinary skill will readily understand usage herein of the terms such as "substantially," "about," "approximately," and the like.

The use of the term "and/or" includes any and all combinations of one or more of the associated listed items.

Exemplary embodiments have been disclosed herein, and although specific terms are employed, unless otherwise noted, they are to be interpreted in a generic and descriptive sense only and not for purpose of limitation. Also although some embodiments have been described above, it should be understood that these embodiments are provided for illustration only and are not to be construed in any way as limiting the present invention, and that various modifications, changes, alterations, and equivalent embodiments can be made by those skilled in the art without departing from the spirit and scope of the invention. The scope of the present invention should be defined by the appended claims and equivalents thereof.

What is claimed is:

1. A thermoplastic resin composition comprising:
    about 100 parts by weight of a polyester resin comprising a repeat unit represented by Formula 1;
    about 1 part by weight to about 60 parts by weight of glass fibers based on about 100 parts by weight of the polyester resin;
    about 20 parts by weight to about 90 parts by weight of a white pigment based on about 100 parts by weight of the polyester resin;
    about 0.1 parts by weight to about 15 parts by weight of an aromatic vinyl-olefin copolymer based on about 100 parts by weight of the polyester resin; and
    about 0.1 parts by weight to about 10 parts by weight of talc based on about 100 parts by weight of the polyester resin,
    wherein the aromatic vinyl-olefin copolymer and the talc are present in a weight ratio of about 1:0.01 to about 1:10,

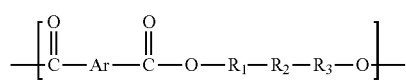
[Formula 1]

where Ar is a $C_6$ to $C_{18}$ arylene group, $R_1$ and $R_3$ are each independently a $C_1$ to $C_{10}$ linear alkylene group, and $R_2$ is a $C_5$ to $C_{12}$ cyclic alkylene group.

2. The thermoplastic resin composition according to claim 1, wherein the polyester resin comprises a repeat unit represented by Formula 1a:

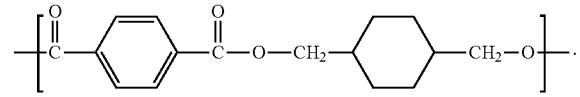
[Formula 1a]

3. The thermoplastic resin composition according to claim 1, wherein the white pigment comprises titanium oxide, zinc oxide, zinc sulfide, zinc sulfate, barium sulfate, calcium carbonate, and/or alumina.

4. The thermoplastic resin composition according to claim 1, wherein the aromatic vinyl-olefin copolymer comprises a styrene-butylene block copolymer, a styrene-isobutylene block copolymer, a styrene-isobutylene-styrene block copolymer, a styrene-ethylene-butylene-styrene block copolymer, and/or a maleic anhydride-grafted styrene-ethylene-butylene-styrene block copolymer.

5. The thermoplastic resin composition according to claim 1, wherein the thermoplastic resin composition has a reflectance of about 92% to about 99%, as measured on a specimen having a size of 90 mm×50 mm×2.5 mm under illumination at a wavelength of 450 nm in accordance with ASTM E1331.

6. The thermoplastic resin composition according to claim 1, wherein the thermoplastic resin composition has a reflectance retention rate of about 90% to about 99%, as calculated according to Equation 1:

Reflectance retention rate (%)=$[(Rf_0-Rf_1)/Rf_0] \times 100$    [Equation 1]

wherein $Rf_0$ is an initial reflectance of a specimen having a size of 90 mm×50 mm×2.5 mm, as measured under illumination at a wavelength of 450 nm in accordance with ASTM E1331, and $Rf_1$ is a reflectance of the specimen, as measured under illumination at a wavelength of 450 nm in accordance with ASTM E1331 after a constant temperature/humidity test in which the specimen is left at 85° C. and 85% RH for 300 hours.

7. The thermoplastic resin composition according to claim 1, wherein the thermoplastic resin composition has an unnotched Izod impact strength of about 10 kgf·cm/cm to about 30 kgf·cm/cm, as measured on a ⅛" thick Izod specimen in accordance with ASTM D256.

8. The thermoplastic resin composition according to claim 1, wherein the thermoplastic resin composition has:
    a reflectance of about 92% to about 99%, as measured on a specimen having a size of 90 mm×50 mm×2.5 mm under illumination at a wavelength of 450 nm in accordance with ASTM E1331;
    a reflectance retention rate of about 90% to about 99%, as calculated according to Equation 1:

Reflectance retention rate (%)=$[(Rf_0-Rf_1)/Rf_0] \times 100$    [Equation 1]

wherein $Rf_0$ is an initial reflectance of a specimen having a size of 90 mm×50 mm×2.5 mm, as measured under illumination at a wavelength of 450 nm in accordance with ASTM E1331, and $Rf_1$ is a reflectance of the specimen, as measured under illumination at a wavelength of 450 nm in accordance with ASTM E1331 after a constant temperature/humidity test in which the specimen is left at 85° C. and 85% RH for 300 hours; and an unnotched Izod impact strength of about 10 kgf·cm/cm to about 30 kgf·cm/cm, as measured on a ⅛" thick Izod specimen in accordance with ASTM D256.

9. A molded article formed of the thermoplastic resin composition according to claim 1.

10. The molded article according to claim 9, wherein the molded article is a reflector for a LED.

11. The molded article according to claim 9, wherein the molded article is a reflector cup for a LED.

12. The thermoplastic resin composition according to claim 1, wherein the thermoplastic resin composition has a release resistance force of about 15 N to about 210 N as determined by measuring force on a center ejector pin upon ejection of a circular injection molded specimen having a diameter of 100 mm and a thickness of 2 mm using a pressure sensor.

* * * * *